(12) United States Patent
Dinur

(10) Patent No.: US 7,092,454 B2
(45) Date of Patent: Aug. 15, 2006

(54) METHOD AND APPARATUS OF COMPENSATING IMBALANCE OF A MODULATOR

(75) Inventor: Nati Dinur, Omer (IL)

(73) Assignee: Intel Corporation, Santa Clara, CA (US)

( * ) Notice: Subject to any disclaimer, the term of this patent is extended or adjusted under 35 U.S.C. 154(b) by 763 days.

(21) Appl. No.: 10/218,116

(22) Filed: Aug. 14, 2002

(65) Prior Publication Data

US 2004/0032913 A1    Feb. 19, 2004

(51) Int. Cl.
*H04L 27/36*    (2006.01)
(52) U.S. Cl. ............ 375/298; 375/297; 375/296
(58) Field of Classification Search ............ 375/298, 375/297, 296
See application file for complete search history.

(56) References Cited

U.S. PATENT DOCUMENTS

| 5,012,208 | A | | 4/1991 | Makinen et al. |
| 6,107,910 | A | * | 8/2000 | Nysen ............ 340/10.1 |
| 6,298,096 | B1 | * | 10/2001 | Burgin ............ 375/296 |

FOREIGN PATENT DOCUMENTS

| EP | 0503588 A2 | * | 9/1992 |
| EP | 0598585 A2 | | 5/1994 |
| WO | WO 03/043206 A2 | | 5/2003 |

OTHER PUBLICATIONS

James A. Cavers and Maria W. Liao, "Adaptive Compensation for Imbalance and Offset Losses in Direct Conversion Transceivers" IEEE Transactions and Vehicular Technology, vol. 42, No. 4, Nov. 1993, pp. 581-588.
Faulkner M. et al., "Automatic Adjustment of Quadrature Modulators", Electronic Letters, Jan. 31, 1991, pp. 214-216, vol. 27, No. 3, IEE Stevenage, GB.
Hilborn D. S. et al., "An Adaptive Direct Conversion Transmitter", IEEE Transactions On Vehicular Technology, May 1, 1994, pp. 223-233, vol. 43 No. 2, IEE Inc., New York, US.
PCT Search Report for PCT/US 03/19876, Dated Nov. 6, 2003.

* cited by examiner

*Primary Examiner*—Chieh M. Fan
*Assistant Examiner*—Anna Ziskind
(74) *Attorney, Agent, or Firm*—Pearl Cohen Zedek Latzer, LLP

(57) ABSTRACT

Briefly, a method and apparatus to compensate an imbalance of a modulator by providing calibration parameters to a calibration network. The modulator may receive a pair of predetermined sinusoidal in-phase and quadrature signals and output a distorted modulated signal. A processor may process spectral parameters at first and second harmonics of a detected envelope signal of the distorted modulated signal may generate the calibration parameters.

19 Claims, 4 Drawing Sheets

METHOD AND APPARATUS OF COMPENSATING IMBALANCE OF A MODULATOR

BACKGROUND OF THE INVENTION

Modulators may be used in transmitters to modulate an input signal that may comprise data and voice with a radio frequency (RF) signal. The modulated signal may be transmitted over the air. For example, types of modulators may include a quadrature modulator. A quadrature modulator may receive an in-phase signal (I) and a quadrature signal (Q) and modulate the I and Q signals with an RF signal. However, various factors related to the physical structure of the modulator, such as for example, leakage of a local oscillator, an imbalance in the amplitude and/or phase of the I and Q signals, and the like, may cause the modulator to produce a modulated signal that is distorted. Consequently, the transmit signal may also be distorted.

Thus, there is a need for better ways to provide an undistorted modulated signal.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanied drawings in which:

Figure 1:
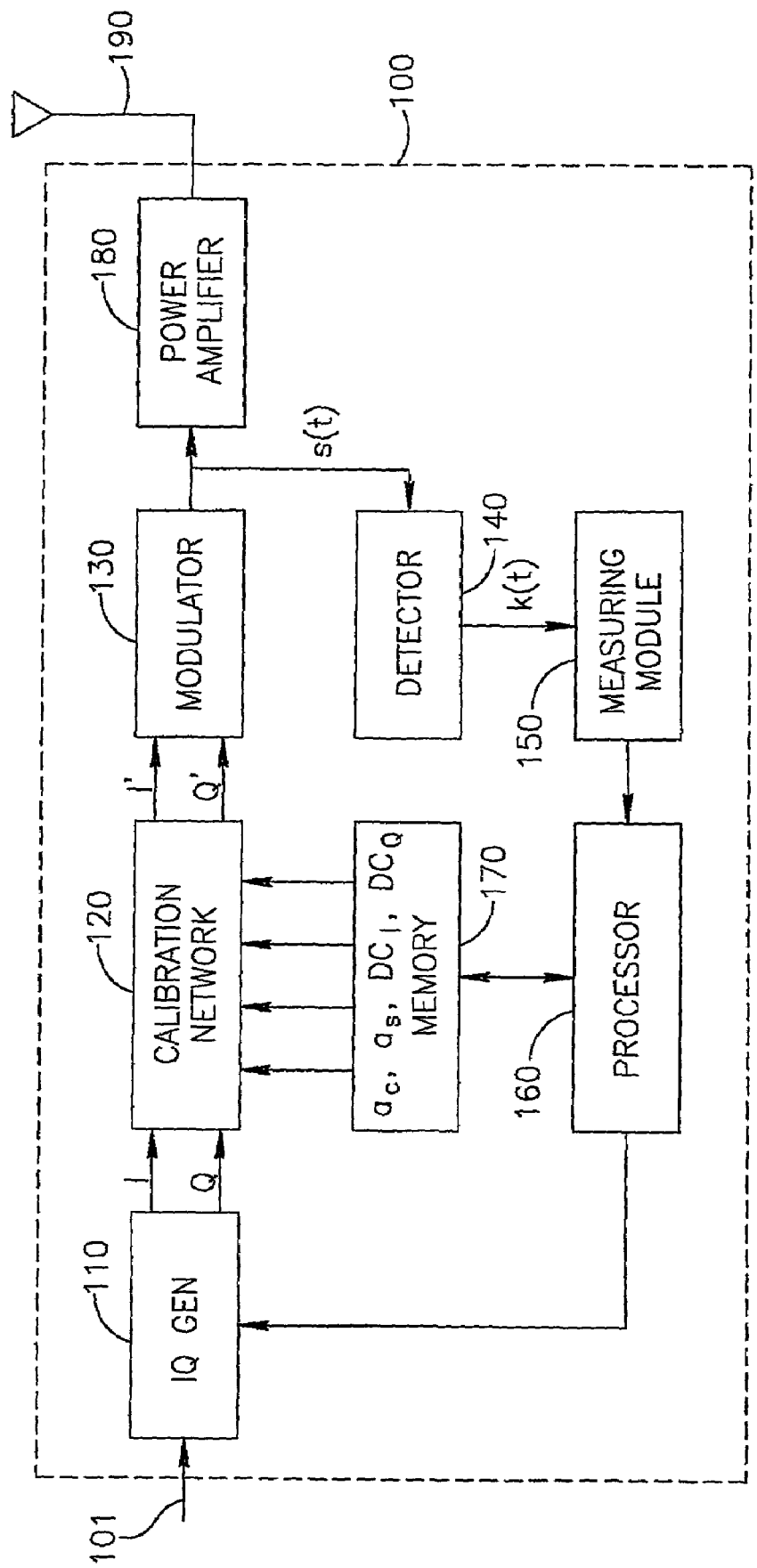
FIG. 1 is a block diagram of a transmitter, according to an embodiment of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However it will be understood by those of ordinary skill in the art that the present invention may be practiced without these specific details. In other instances, well-known methods, procedures, components and circuits have not been described in detail so as not to obscure the present invention.

Some portions of the detailed description, which follow, are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices. Furthermore, the term "envelope signal" may refer to the sun of the squares of I and Q signals and to the sum of electric powers of the I and Q signals.

It should be understood that the present invention may be used in a variety of applications. Although the present invention is not limited in this respect, the circuits and techniques disclosed herein may be used in many apparatuses such as transmitters of a radio system. Transmitters intended to be included within the scope of the present invention include, by way of example only, wireless local area network (LAN) transmitters, two-way radio transmitters, digital system transmitters, analog system transmitters, cellular radiotelephone transmitters and the like.

Types of wireless local area network (LAN) transmitters intended to be within the scope of the present invention include, although are not limited to, transmitters for transmitting spread spectrum signals such as, for example, Frequency Hopping Spread Spectrum (FHSS), Direct Sequence Spread Spectrum (DSSS) and the like.

Turning to FIG. 1, a transmitter 100 in accordance with an embodiment of the invention is shown. The transmitter 100 may comprise an in-phase/quadrature (IQ) generator 110, a calibration network 120, a modulator 130, a detector 140, a measuring module 150, a processor 160, a memory 170, a power amplifier 180 and an antenna 190. Although it should be understood that the scope and application of the present invention is in no way limited to these examples, types of modulators that may be used with embodiments of the present invention may include quadrature modulators, direct conversion modulators, frequency conversion modulators, and the like.

In an embodiment of the present invention, transmitter 100 may transmit signals, for example, over a wireless LAN. Although the scope of the present invention is not limited in this respect, transmitter 100 may have two modes of operation. In a first mode of operation, IQ generator 110 may generate I and Q signals based on an input signal 101. Calibration network 120 may modify the I and Q signals to produce compensated I' and Q' signals. Calibration network 120 may compensate for imbalance of modulator 130. Although the scope of the present invention is not limited in this respect, imbalance of modulator 130 may be due to leakage of a local oscillator (LO), an imbalance in the amplitude and/or phase of the I and Q signals, and the like. Modulator 130 may then modulate an RF signal with the I' and Q' signals. The output of modulator 130, a compensated modulated signal, may be amplified by power amplifier 180 and then transmitted through antenna 190, if desired. Although the scope of the present invention is not limited in this respect, antenna 190 may be a dipole antenna, a shot antenna, a printed antenna, and the like.

Although the scope of the present invention is not limited in this respect, in a second operation mode of transmitter 100, which may be described as a calibration mode of transmitter 100, processor 160 may provide input to IQ generator 110. IQ generator 110 may generate I and Q signals according to these inputs, if desired. In this operation mode, the I and Q signals may be used as calibration signals. Although the scope of the present invention is not limited in this respect, calibration signals may be signals that include predetermined characteristics that when modulated by a modulator may generate certain spectral parameters in the modulated signal. Furthermore, the spectral parameters may be used to generate calibration parameters, if desired. The calibration parameters may compensate for the imbalance of modulator 130.

Although the scope of the present invention is not limited in this respect, calibration signals I and Q may be inputted to calibration network 120. Calibration network 120 may manipulate calibration signals I and Q with calibration parameters, and may output compensated signals I' and Q'. Compensated signals I' and Q' may be inputted to modulator 130. A detailed description of an example of calibration network 120 will be provided with reference to FIG. 2.

Although the scope of the present invention is not limited in this respect, modulator 130 may receive a pair of calibration signals I' and Q' and provide a distorted modulated signal s(t).

Although the scope of the present invention is not limited to this respect, an example of the distorted modulated signal s(t) may be provided by equation 1.

$$s(t)=I(t)\cdot\cos(\omega_0 t)-Q(t)\cdot A\,\sin(\omega_0 t+\phi)+J\cos(\omega_0 t+\phi_1) \quad \text{Eq. 1}$$

wherein in this particular example:
- I(t) is the in-phase component of the distorted modulated signal;
- $\omega_0$ is the frequency of the RF signal;
- Q(t) is the quadrature component of the distorted modulated signal;
- A is the amplitude mismatch;
- $\phi$, $\phi_1$ are the phase error; and
- J is the amplitude of LO leakage.

Although the scope of the present invention is not limited in this respect, detector 140 may detect an envelope of the distorted modulated signal s(t) and may provide an envelope signal k(t), if desired. Detector 140 may be, for example, an envelope detector such as a diode, a transistor, or the like. In addition, measuring module 150 may receive the distorted modulated signal s(t) and the envelope signal k(t). Measuring module 150 may measure a spectral parameter at a first harmonic of the envelope signal k(t). Although the scope of the present invention is not limited in this respect, the spectral parameter may be an amplitude value of a Fourier series, as is known to one skilled in the art. Furthermore, measuring module 150 may measure a spectral parameter at a second harmonic of the envelope signal k(t), if desired. In addition, the spectral parameter measured at the second harmonic of k(t) may be equivalent to an electric power of the signal s(t). Although the scope of the present invention is not limited to this example, measuring module 150 may be an analog to digital converter, a digital processor, an analog computer, and the like.

Although the scope of the present invention is not limited in this respect, processor 160 may receive the measurement from measuring module 150 and may generate calibration parameters accordingly. Although the scope of the present invention is not limited in this respect, processor 160 may be a digital signal processor (DSP), a reduced instruction set computer (RISC) processor, a microprocessor, a microcontroller, a custom integrated circuit to perform a pre-defined algorithm and/or method and the like. Furthermore, processor 160 may use methods and/or algorithms to generate the calibration parameters. Detailed examples of such algorithms will be provided with reference to FIGS. 3 and 4. In addition, processor 160 may use memory 170 to receive and store calibration parameters, coefficients that may be used in calculations, and the like.

Although the scope of the present invention is not limited in tis respect, memories that may be used with the present invention such as, for example memory 170, may be a register, a flip-flop, a Flash memory, a random access memory (RAM), dynamic RAM (DRAM), static RAM (SRAM) and the like. Furthermore, memory 170 may be used to provide the calibration parameters to calibration network 120.

Figure 2:
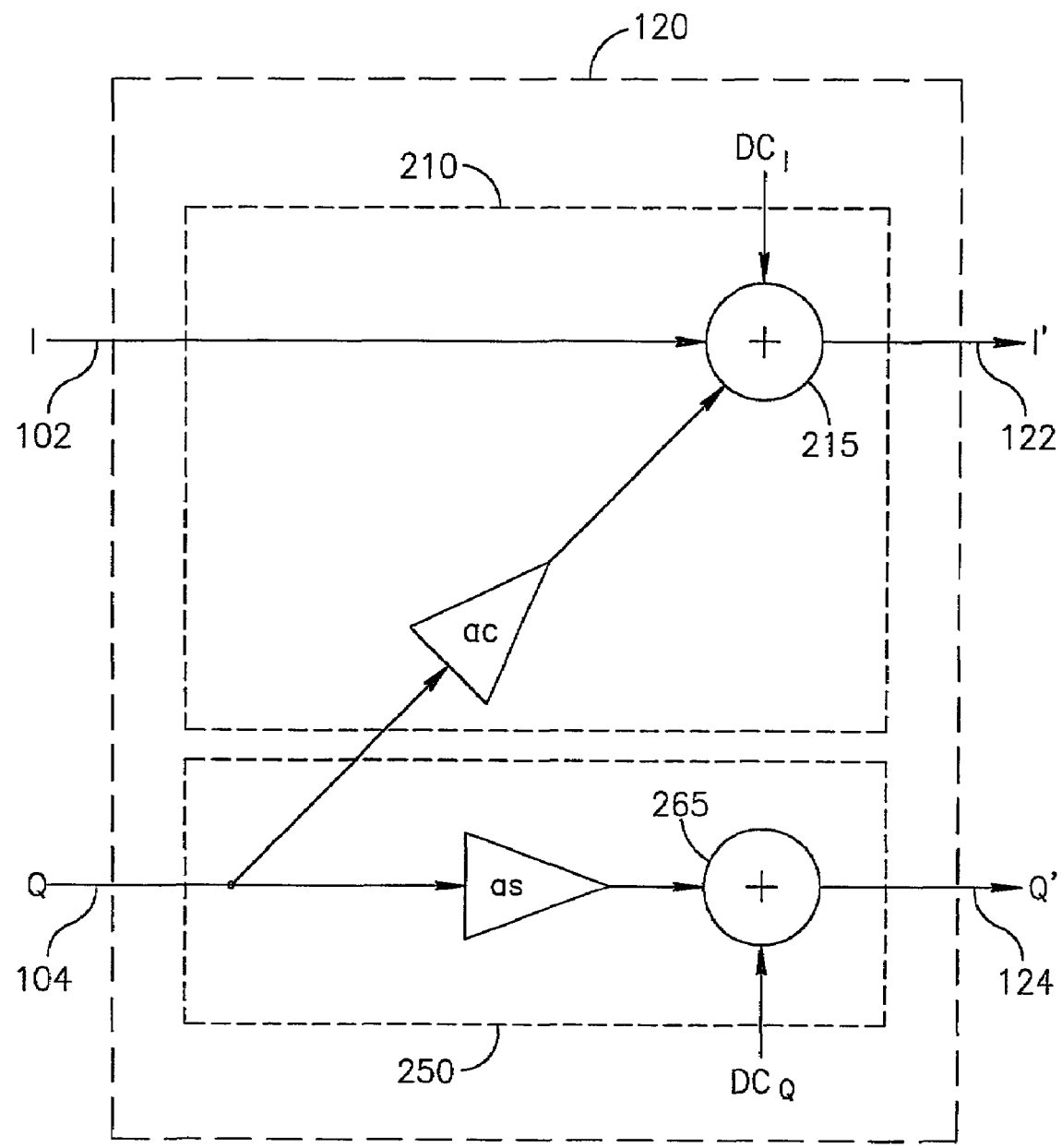
FIG. 2 is a schematic illustration of a calibration network helpful in understanding some embodiments of the present invention.

Turning to FIG. 2, an exemplary embodiment of calibration network 120 is shown. Although the scope of the present invention is not limited in this respect, calibration network 120 may include an in-phase (I) module 210 and a quadrature module 250. More particularly, I module 210 may include an adder 215 and calibration parameters $DC_I$ and $a_c$. Q module 250 may include an adder 265 and calibration parameters $DC_Q$ and $a_s$. For example, in one embodiment of the present invention, calibration parameters $DC_I$ and $DC_Q$ may compensate an imbalance that may be generated as result of a leakage of a local oscillator of modulator 130 and/or by a DC offset, calibration parameter $a_s$ may compensate an imbalance of amplitude of the I signal and Q signal at modulator 130, and calibration parameter $a_c$ may compensate an imbalance of phase at I signal and Q signal at modulator 130, if desired.

In operation, I module 210 may provide a signal 122 which includes the calibration parameters $DC_I$ and $a_c$. Adder 215 may add calibration parameters $DC_I$ and $a_c$ to I signal 102 and output signal 122. Signal 122 may compensate an imbalance of an I branch (not shown) at modulator 130. In addition, Q module 250 may provide a signal 124 which includes calibration parameters $DC_Q$ and $a_s$. Adder 265 may add calibration parameters $DC_Q$ and $a_s$ to Q signal 104 and output signal 124. Signal 124 may compensate an imbalance of a Q branch (not shown) at modulator 130. However, in alternative embodiments of the present invention, other calibration networks may be used, if desired. For example, the $a_s$ calibration may be performed by the I module and the $a_c$ calibration may be performed by the Q module.

Figure 3:
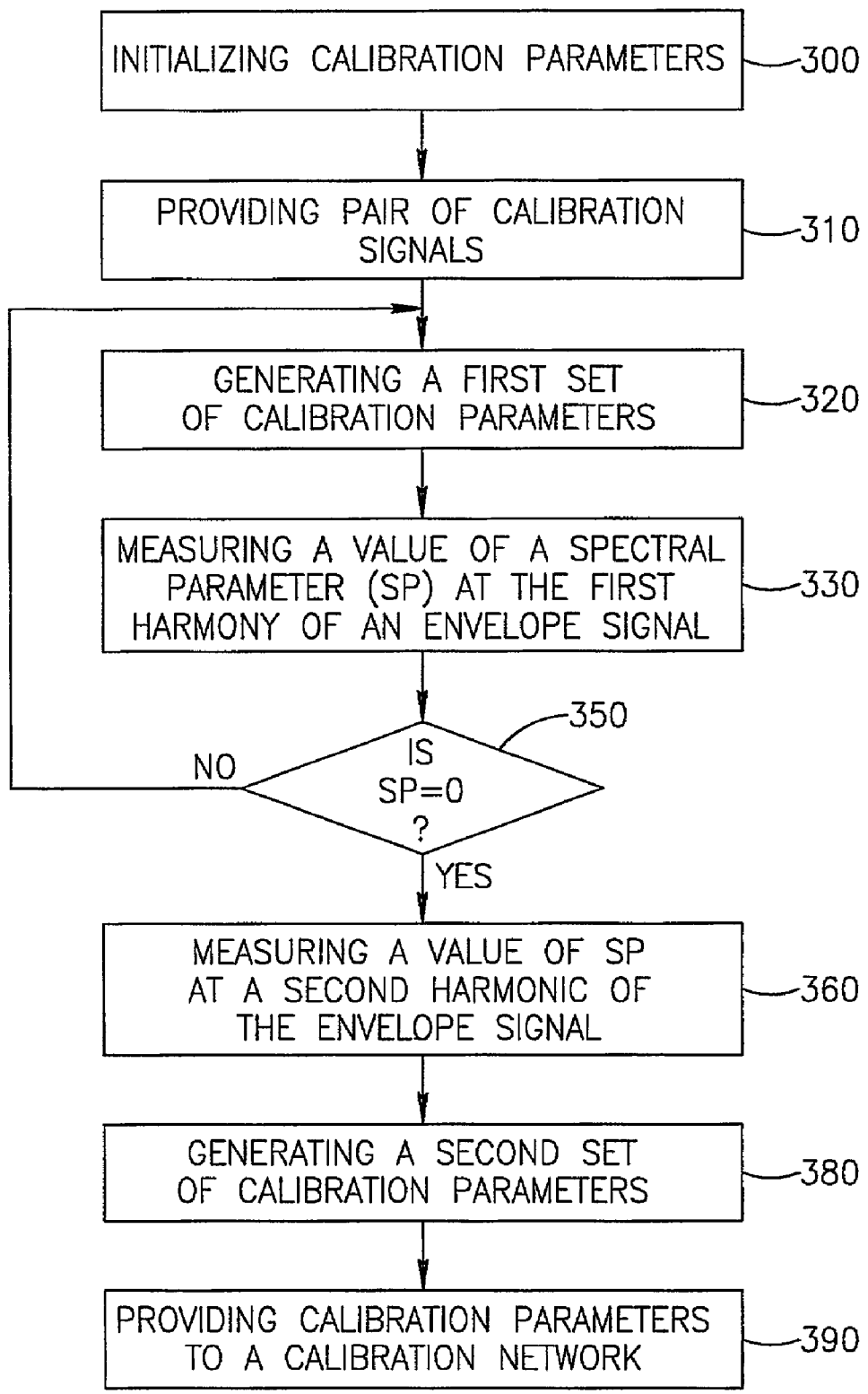
FIG. 3 is a flowchart of a method according to an embodiment of the present invention.

Turning to FIG. 3, a flow chart of a method for compensating an imbalance of modulator 130 is shown. Although the scope of the present invention is not limited in this respect, the method may begin with initializing the calibration parameters, for example, $a_c=0$, $a_s=1$, $DC_I=0$ and $DC_Q=0$ (block 300). The method may proceed with providing a pair of calibration signals, for example I and Q signals 102 and 104, respectively, to modulator 130 (block 310). For example, the modulator 130 may receive, through the calibration network 120, the following three pairs of signals, where $\delta$ is a direct current (DC) constant. The first pair may be I=$\delta$+cos($\omega_1 t$), Q=$\delta$+sin($\omega_1 t$); the second pair may be I=$-\delta$+cos($\omega_1 t$), Q=$\delta$+sin($\omega_1 t$); and the third pair may be I=$-\delta$+cos($\omega_1 t$), Q=$-\delta$+sin($\omega_1 t$). Measuring module 150 may correlate the envelope signal k(t) with cos($\omega_1 t$) to yield coefficients $y_1$, $y_2$, $y_3$, and with sin($\omega_1 t$) to yield coefficients $y_4$, $y_5$, $y_6$. Although, the scope of the present invention is not limited in this respect coefficients, $y_1$, $y_2$, $y_3$, $y_4$, $y_5$, $y_6$ may be, for example, the spectral parameters discussed above with reference to FIG. 1. Processor may store the $y_1$–$y_6$ coefficients at memory 170, and may use the $y_1$–$y_6$ coefficients to generate a first set of calibration parameters (block 320). Although the scope of the present invention is not limited in this respect, the first set of parameters may be $DC_I$ and $DC_Q$ and the second set of calibration parameters may be $a_s$ and $a_c$. Processor 160 may use the flowing equations to generate $DC_I$ and $DC_Q$:

$$DC_I = DC_I old + \frac{(y_2 - y_3)(y_4 + y_6) - (y_5 - y_6)(y_1 + y_3)}{(y_5 - y_6)(y_1 - y_2) - (y_2 - y_3)(y_4 + y_5)} \delta$$

$$DC_Q = DC_Q old + \frac{(y_1 - y_2)(y_4 + y_6) - (y_4 - y_5)(y_1 + y_3)}{-(y_5 - y_6)(y_1 - y_2) + (y_2 - y_3)(y_4 + y_5)} \delta$$

wherein $DC_I$old and $DC_Q$old may be previous calculated or set values. Measuring module 150 may measure a value of a spectral parameter (SP) at a first harmonic of the envelope signal k(t) (block 330). Processor 160 may regenerate $DC_I$ and $DC_Q$ if the value of SP is above zero (block 350). In alternative embodiments of the present invention, $DC_I$ and $DC_Q$ may also be regenerated when SP is above zero.

Although the scope of the present invention is not limited in this respect, the method may proceed with measuring a value of SP at a second harmonic of the envelope signal k(t) (block 360) and generating a second set of calibration parameters, for example $a_c$ and $a_s$ (block 380). It should be appreciated by one skilled in the art that the value of SP at the second harmonic may be proportional to an electric power of s(t). A detailed example of a method of generating $a_s$ and $a_c$ will now be described with reference to FIG. 4

Figure 4:
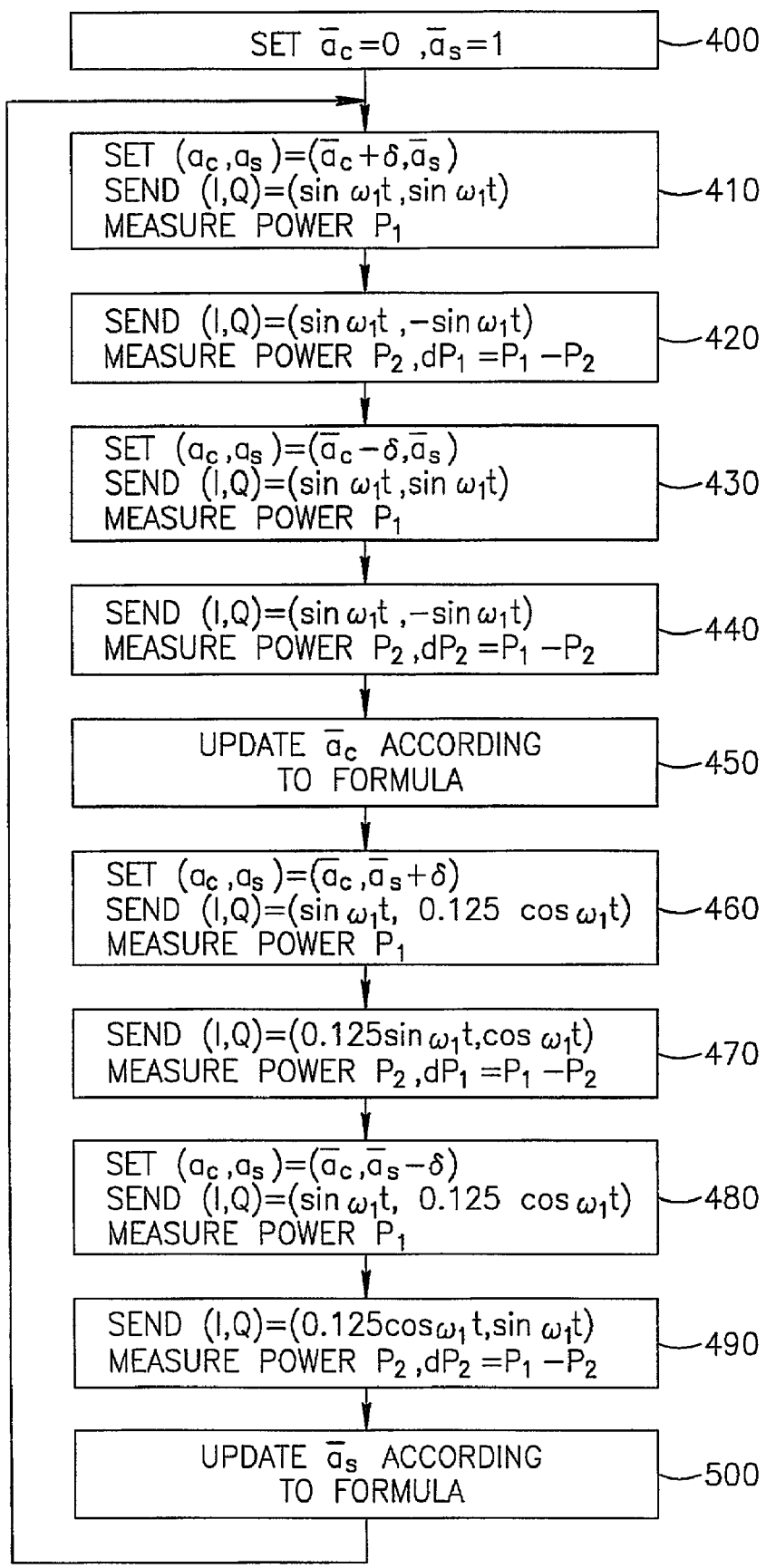
FIG. 4 is a flowchart of a method of generating some calibration parameters according to an embodiment of the present invention.

Turning to FIG. 4, the method may begin with setting initial mean values to $a_s$ and $a_c$, for example $\bar{a}_c=0$ and $\bar{a}_s=1$ (block 400). Initial values for $DC_I$ and $DC_Q$ may be provided from processor 160. The method may proceed with updating $\bar{a}_c$. The algorithm of updating $\bar{a}_c$ may begin with adding a distortion value $\delta$ to $\bar{a}_c$, sending I and Q signals with substantially the same signal (sin $\omega_1 t$) and measuring the electric power of s(t), namely, $P_1$ (block 410). Although the scope of the present invention is not limited in this respect, measuring of the electric power may be done by processing envelope signal k(t) and calculating $P_1$ according to the following equation $p=\int k(t)$. For example, processing the envelope k(t) and calculating P1 value, may be done by processor 160 or measuring module 150. However, in alternative embodiment of the present invention the processing and calculating may be done by different processors or by different hardware or software modules, if desired. In addition, in some embodiments of the present invention the calculation of P1 may be performed according to the equation: $P1=\sqrt{(\int k(t)\cos(2\omega_1 t))^2+(\int k(t)\sin(2\omega_1 t))^2}$. Furthermore, the integrals in both equations may be taken over a constant multiple of $\omega_1$ period. The method may proceed with sending opposite I and Q signals, for example, sin $\omega_1 t$, $-\sin \omega_1 t$ respectively, measuring the electric power of s(t) $P_2$, and calculating $dP_1=P_1-P_2$ (block 420). As shown in blocks 430 and 440, the operation of blocks 410 and 420 may be repeated with a negative distortion value of $\delta$. In addition, dP2 may be provided by $dP2=P1-P2$. The algorithm of updating $\bar{a}_c$ may end by calculating $\bar{a}_c$ using the following equation:

$$\bar{a}_c = \bar{a}_c old - \frac{dP_1 + dP_2}{dP_1 - dP_2} \delta,$$

wherein $\bar{a}_c$old may be a previously calculated value of $\bar{a}_c$.

Although the scope of the present invention is not limited in this respect, an algorithm for updating $\bar{a}_s$ is shown at blocks 460, 470, 480, 490 and 500. The algorithm for updating $\bar{a}_s$ may begin with adding distortion value $\delta$ to $\bar{a}_s$, sending I and Q signals with different amplitudes, for example, sin $\omega_1 t$, 0.125 cos $\omega_1 t$ and measuring the electric power of s(t), namely, $P_1$ (block 460). The method may proceed with sending I and Q signals with different amplitudes, for example, 0.125 sin $\omega_1 t$, cos $\omega_1 t$ respectively, measuring the electric power of s(t) $P_2$, and calculating $dP_1=P_1-P_2$ (block 470). As shown in blocks 480 and 490, the operation of blocks 460 and 470 may be repeated with a negative distortion value of $\delta$. In addition, the value for dP2 may be calculated by $dP2=P1-P2$. The algorithm of updating $\bar{a}_s$ may end with calculating $\bar{a}_s$ using the following equation:

$$\bar{a}_s = \bar{a}_s old - \frac{dP_3 + dP_4}{dP_3 - dP_4} \delta + \frac{\delta^2}{2},$$

wherein $\bar{a}_s$old may be a previous value of $\bar{a}_s$. Although the scope of the present invention is not limited in this respect, the values of $\bar{a}_c$ and $\bar{a}_s$ may be updated repeatedly until dP1 and dP2 are substantially equal to zero, if desired.

Although the scope of the present invention is not limited in this respect, calibration parameters $DC_I$, $DC_Q$, $a_c$ and $a_s$ may be set to transmitter 100 after the calibration processes described above have been completed. Thus, transmitter 100 may transmit undistorted modulated signal.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An apparatus comprising:
   a modulator to generate a distorted modulated signal based on a pair of calibration signals;
   a detector to detect an envelope of the distorted modulated signal to produce a detected envelope signal;
   an in-phase/quadrature phase generator to send said pair of calibration signals over one of an in-phase branch and a quadrature branch of a calibration network; and
   a processor to generate first and second sets of calibration parameters, wherein said processor is able to compensate an imbalance of the modulator and wherein the generation of the second set of calibration parameters results in a value of a spectral parameter of a second harmonic of said detected envelope signal being substantially equal to an electric power of the distorted modulated signal.

2. The apparatus of claim 1, wherein said calibration network is able to compensate the modulator imbalance by manipulating at least one of the first and second sets of calibration parameters.

3. The apparatus of claim 1 wherein the pair of calibration signals comprises:
   a pair of sinusoidal signals at predetermined frequencies and predetermined amplitudes.

4. The apparatus of claim 1, further comprising:
   a measuring module to measure a spectral component at first and second harmonics of the detected envelope signal.

5. The apparatus of claim 1, wherein the modulator comprises a quadrature modulator.

6. The apparatus of claim 1, further comprising:
an amplifier to amplify the modulated signal compensated by the calibration parameters.

7. A method comprising:
providing first and second sets of calibration parameters to a calibration network by modulating a pair of calibration signals and measuring spectral parameters at first and second harmonics of a detected envelope signal of the modulated calibration signals, wherein providing the second set of calibration parameters comprises:
generating a set of calibration parameters that result in a value of a spectral parameter of a second harmonic of the detected envelope signal being substantially equal to an electric power of the modulated calibration signal when sending said pair of calibration signal over one of an in-phase branch and a quadrature branch of the calibration network.

8. The method of claim 7 wherein providing calibration parameters comprises generating the first set of calibration parameters that result in a measured value of substantially zero of the spectral parameter of the first harmonic.

9. The method of claim 7 wherein, providing the second set of parameters comprises:
generating the second set of parameters that result in said value of the spectral parameter of the second harmonic of the detected envelope signal substantially equal to the electric power of said modulated calibration signal when sending substantially the same calibration signals over the in-phase branch and the quadrature branch of the calibration network, and when sending opposite calibration signals over the in-phase branch and the quadrature branch.

10. A radio system comprising:
a transmitter having:
    a modulator to generate a distorted modulated signal according to a pair of calibration signals;
    an in-phase/quadrature phase generator to send said pair of calibration signals over one of an in-phase branch and a quadrature branch of a calibration network; and
    a processor to generate first and second sets of calibration parameters able to compensate an imbalance of the modulator and wherein the generation of the second set of calibration parameters results in a value of a spectral parameter of a second harmonic of a detected envelope signal of the distorted modulated signal being substantially equal to an electric power of the distorted modulated signal; and
a dipole antenna operably coupled to the transmitter to transmit a modulated signal compensated by the calibration parameters.

11. The radio system of claim 10, wherein the transmitter comprises:
a detector to detect an envelope of the distorted modulated signal.

12. The radio system of claim 10, wherein the calibration network able to compensate the modulator imbalance by manipulating at least one of the first and second sets of the calibration parameters.

13. The radio system of claim 10 wherein, the pair of calibration signals comprises:
a pair of sinusoidal signals having predetermined frequencies and predetermined amplitudes.

14. The radio system of claim 10, wherein the transmitter comprises:
a measuring module to measure a spectral component at first and second harmonic of the detected envelope signal.

15. The radio system of claim 10, wherein the modulator comprises a quadrature modulator.

16. The radio system of claim 10, wherein the transmitter comprises:
a power amplifier to amplify the compensated modulated signal.

17. An article comprising: a storage medium, having stored thereon instructions, that when executed by a processor, result in:
providing first and second sets of calibration parameters to a calibration network by modulating a pair of predetermined sinusoidal signals and measuring spectral parameters at first and second harmonics of a detected envelope signal of a modulated signal, wherein providing the second set of calibration parameters comprises:
generating the second set of calibration parameters such that a value of the spectral parameter of the second harmonic of the detected envelope signal is substantially equal to an electric power of the modulated signal when sending substantially the same calibration signal over one of an in-phase branch and a quadrature branch of the calibration network.

18. The article of claim 17, wherein the instructions of providing, that when executed, further result in:
generating the first set of calibration parameters that result in a measured value of substantially zero of the spectral parameter of the first harmonic.

19. The article of claim 18, wherein the instruction of generating, that when executed, further result in:
generating the second set of parameters that result in the value of the spectral parameter of the second harmonic of the detected envelope signal substantially equal to said electric power of the modulated signal when sending substantially the same calibration signals over the in-phase branch and the quadrature branch of the calibration network, and when sending opposite calibration signals over the in-phase branch and the quadrature branch.

* * * * *